United States Patent [19]

Shen

[11] Patent Number: 4,595,844
[45] Date of Patent: Jun. 17, 1986

[54] CMOS HIGH CURRENT OUTPUT DRIVER
[75] Inventor: Shannon N. Shen, Trumbull, Conn.
[73] Assignee: ITT Corporation, New York, N.Y.
[21] Appl. No.: 571,030
[22] Filed: Jan. 16, 1984
[51] Int. Cl.[4] .......................... H03K 3/26; H03K 3/01; H03K 17/687
[52] U.S. Cl. .................................... 307/270; 307/571; 307/296 R
[58] Field of Search .................... 307/270, 254, 296 R, 307/570, 571

[56] References Cited

U.S. PATENT DOCUMENTS 4,251,742 2/1981 Beelitz ................................. 307/270
4,322,634 3/1982 Kaire et al. ...................... 307/296 R Primary Examiner—Stanley D. Miller
Assistant Examiner—B. P. Davis
Attorney, Agent, or Firm—Peter C. Van Der Sluys; Robert A. Hays

[57] ABSTRACT

A driver circuit is disclosed which is capable of supplying current at a relatively low range for a relatively large supply voltage range. The driver comprises a plurality of output stages designed to operate in parallel. At a low power supply level all the output stages are activated. As the supply voltage is increased the number of output stage is decreased. All the elements of the circuit may be implemented by using transistors so that the whole circuit may be formed on a single IC chip.

5 Claims, 5 Drawing Figures

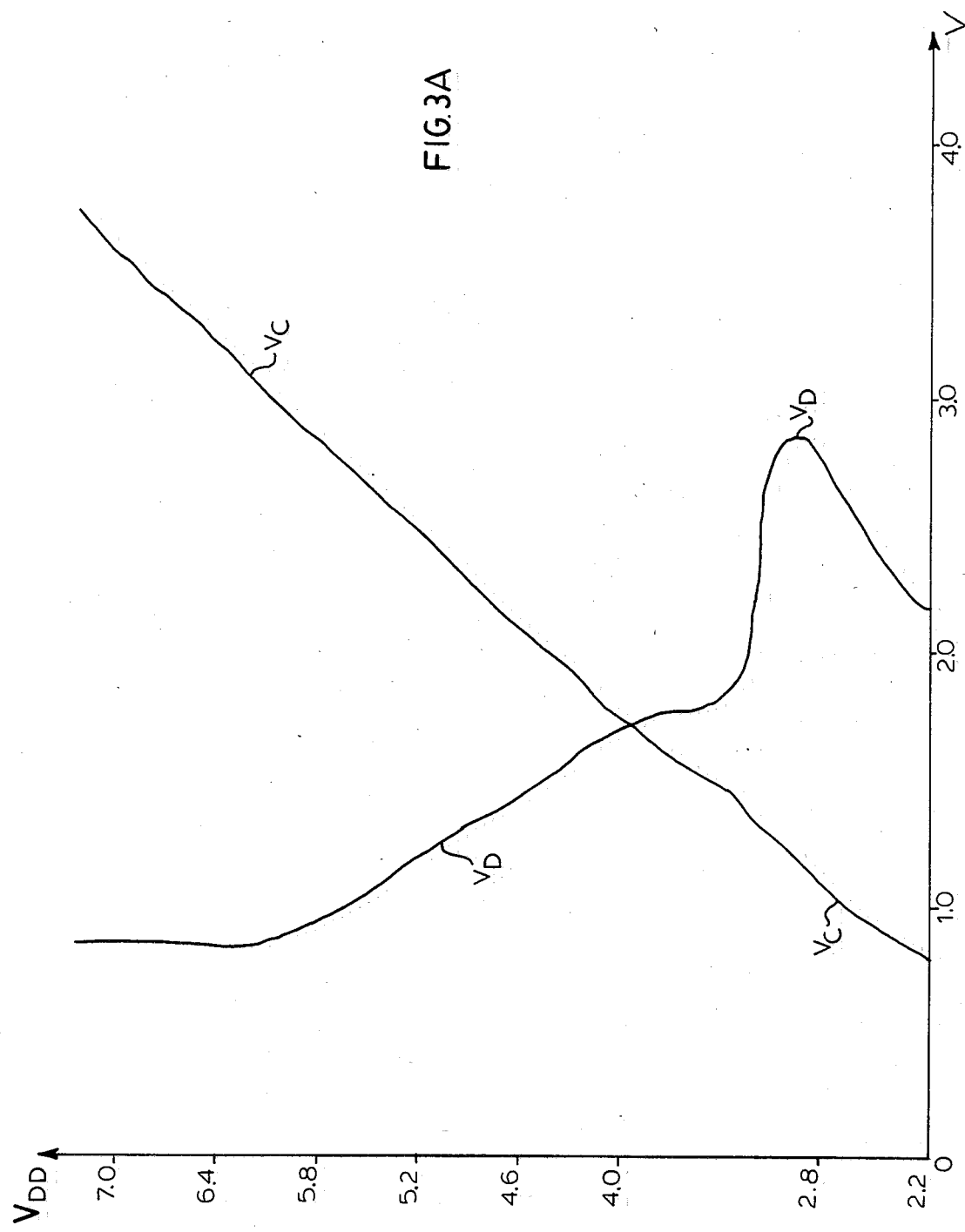

CMOS HIGH CURRENT OUTPUT DRIVER

BACKGROUND OF THE INVENTION

1. Field of Invention

This invention pertains to a CMOS driver for providing a relatively constant current independent of large variations of the supply voltage.

2. Description of the Prior Art

Normally a single stage driver or buffer is used to activate one or more digital logic elements from a single logic signal. Typically the maximum current being delivered by the driver varies as the square of the supply voltage. Therefore for logic circuits operating from power supplies which have a fluctuating or poorly regulated output, the buffers must be designed for the worst-case situation, i.e. the lowest expected power supply voltage. For example if a power supply output can vary from 2 V to 7 V and at 2.2 V a typical driver is designed to output 10 ma, the current output of the same driver at 7.2 V will increase to 800 mA. In order to prevent such a drastic increase a current limiter must be used in series with the driver. However such limiters dissipate power continuously increasing the total power of the driver and the integrated chip comprising the driver.

OBJECTIVES AND SUMMARY OF THE INVENTION

In view of the above, it is an objective of this invention to provide a driver which can supply a relatively constant current regardless of the power supply voltage.

A further objective is to provide a driver which can be formed on a single IC chip or included on a larger IC chip by using CMOS FET's.

Other objectives and advantages of the invention shall become apparent in the following description of the invention. According to this invention a CMOS driver comprises a supply voltage level detection circuit and a plurality of independent output stages, each output stage being adapted to supply current in response to an input signal to a common output port. Each output stage has an input port connected to the biasing stage and provide to activate the respective output port, whereby said biasing stage can selectively activate the output ports in accordance with the supply voltage level.

DESCRIPTION OF THE PREFERRED EMBODIMENT

Figure 1:
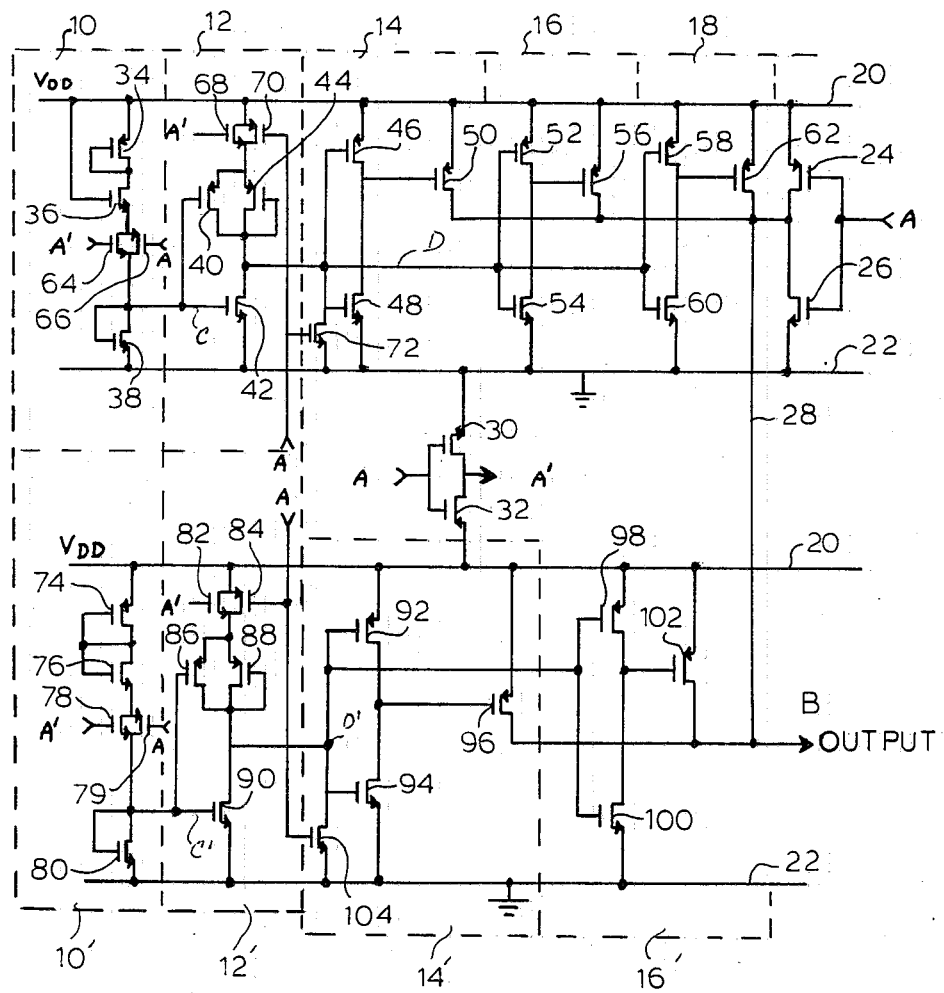
FIG. 1 shows the elements of a driver in accordance with the invention.

As shown in FIG. 1, the present driver comprises a voltage sensing stage 10 a biasing stage 12 and a plurality of output stages 14, 16 and 18.

Initially it must be noted that the driver of FIG. 1 is shown in an inverter configuration. In other words in response to an input A, the circuit generates an output B which is the logical inverse of A, i.e. B=A'. If the circuit is to be used strictly as a driver of other logic gates then an extra inverter should be used ahead of it.

The circuit comprises only MOSFET's so that it may be implemented on single chip alone or as part of a more complex analog and/or digital circuit using CMOS-type techniques. A common positive bus 20 and ground bus 22 is provided for all the stages of the circuit. These buses are energized from a power supply (not shown). The input A is fed to a first inverter comprising two transistors 24 and 26 interconnected as shown. The output of the inverter 24/26 is connected to an output bus 28.

In addition, the input A is connected to a second inverter comprising transistors 30 and 32 to generate an inverted signal A'. The voltage sensing stage 10 comprises three transistors 34, 36 and 38 which are used as non-linear resistors to form a voltage divider. Thus at any given time the voltage at node C, across transistor 38 is always a fraction of the voltage across buses 20 and 22. This node C comprises the input to the biasing stage 12.

Biasing stage 12 comprises transistors 40 and 42 which form a standard inverter, and transistor 44 which has its drain connected to its gate to form a load resistor for transistor 42. Transistors 40 and 42 are formed so that the resulting inverter has a relatively wide transition region. The transistors of stage 10 are selected so that for the voltage range of interest for $V_{DD}$, $V_C$ is in the transition range of inverter 40/42. The output node D of the inverter comprises the biasing bus for the output stages 14, 16 and 18. Each output stage comprises an inverter and an output transistor. For example output stage 14 comprises transistor 46, 48, which form the inverter, and transistor 50. The transistors of the inverter within each stage is selected to have a different threshold voltage. While the inverter of the biasing stage has a rather wide transition region, the inverters of the output stages 14–18 have relatively narrow transition regions so that a small voltage change of the biasing bus could cause a change of state of at least one of the inverters.

The circuit described above functions as follows. A high voltage level (logic 1) on input A turns transistor 26 on, grounding output bus B. At the same time biasing bus D is also grounded through transistor 72 insuring that all the inverters of the output stages have a high output and therefore all output transistors are also off and no current flows therethrough.

Furthermore both the voltage sensing stage 10 and biasing stage 12 are in series with transmission gates. The transmission gate for stage 10 are formed by transistors 64 and 66 while the transmission gate for stage 12 are formed by transistors 68 and 70. These transmission gates have as their control signals the input signal A and its inverse A' derived from the 30/32 inverter. When A is high both transmission gates are turned off and therefore stages 10 and 12 are de-energized. Thus it is evident that for a logic "1" input the whole circuit is de-energized and consumes no power. This represents a considerable saving for the chip in power and heat dissipation.

For a low (logic 0) input, the output of inverter 22/24, and therefore output bus B goes high and current is supplied thereto by transistor 24. In addition, depending on the level of bus voltage $V_{DD}$, some or all of the output stages also supply current to the output bus as follows. If $V_{DD}$ and therefore the voltage of node C, $V_C$ is low, transistor 42 is almost cut off and the voltage $V_D$ on the bias bus is relatively high, above the threshold voltages of all the output stage inverters. Therefore the output of all the stage inverters is low and all the output resistors are turned ON supplying current to output bus B. For higher levels of $V_{DD}$, $V_D$ is lower so that only some of the output stages are ON and supplying current. At a very high level of $V_{DD}$, transistor 42 turns ON pulling $V_D$ to ground and turning OFF all the output stages. In this mode current to bus B is supplied only through transistor 24.

For large swings of $V_{DD}$ a single biasing stage might not be enough to supply a sufficient corresponding swing of $V_D$. In such cases a second biasing stage 12' connected to a second voltage sensing stage 10' may be used. As shown in FIG. 1, two more stages 14' and 16' could be controlled from stages 10' and 12'.

By way of example, the following parameters (width/length) have been chosen for the transistor of FIG. 1:

| Tx | W/L | Tx | W/L | Tx | W/L |
|---|---|---|---|---|---|
| 24 | 750/5 | 52 | 80/5 | 79 | 24/5 |
| 26 | 250/5 | 54 | 48/30 | 80 | 16/25 |
| 30 | 40/5 | 56 | 1250/5 | 82 | 24/5 |
| 32 | 76/5 | 58 | 40/5 | 84 | 48/5 |
| 34 | 32/10 | 60 | 40/5 | 86 | 22/50 |
| 36 | 32/30 | 62 | 2000/5 | 88 | 32/25 |
| 38 | 32/50 | 64 | 12/5 | 90 | 48/5 |
| 40 | 32/20 | 66 | 24/5 | 92 | 36/10 |
| 42 | 50/5 | 68 | 24/5 | 94 | 48/5 |
| 44 | 32/5 | 70 | 48/5 | 96 | 500/5 |
| 46 | 80/5 | 72 | 12/5 | 98 | 40/5 |
| 48 | 80/20 | 74 | 16/10 | 100 | 40/20 |
| 50 | 2500/5 | 76 | 16/25 | 102 | 1250/5 |
|  |  | 78 | 12/5 | 104 | 12/5 |

Figure 3B:
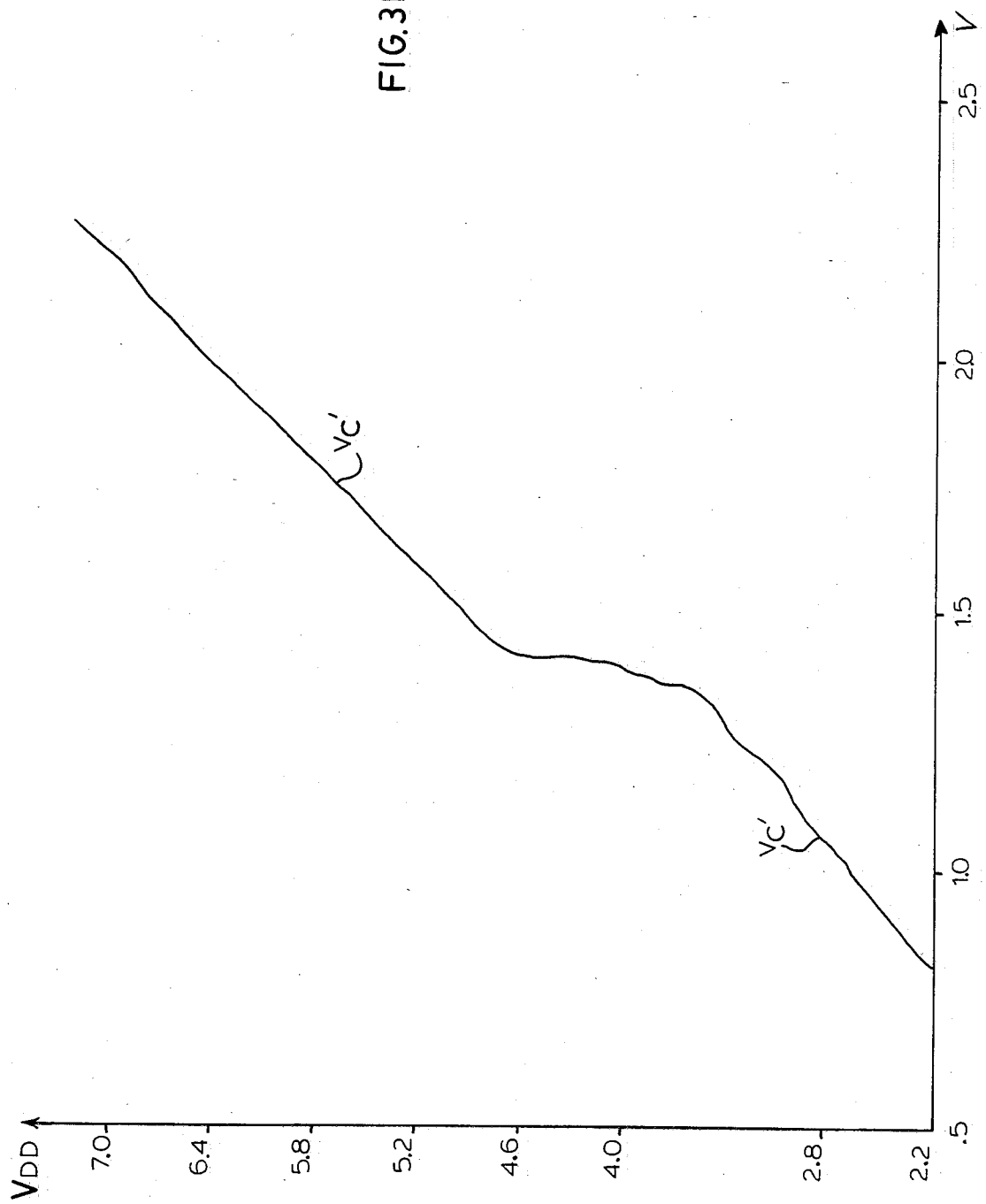
FIGS. 3a, b, and c show the output voltages of the individual stages of the driver as a function of the supply voltage level.
Figure 3C:
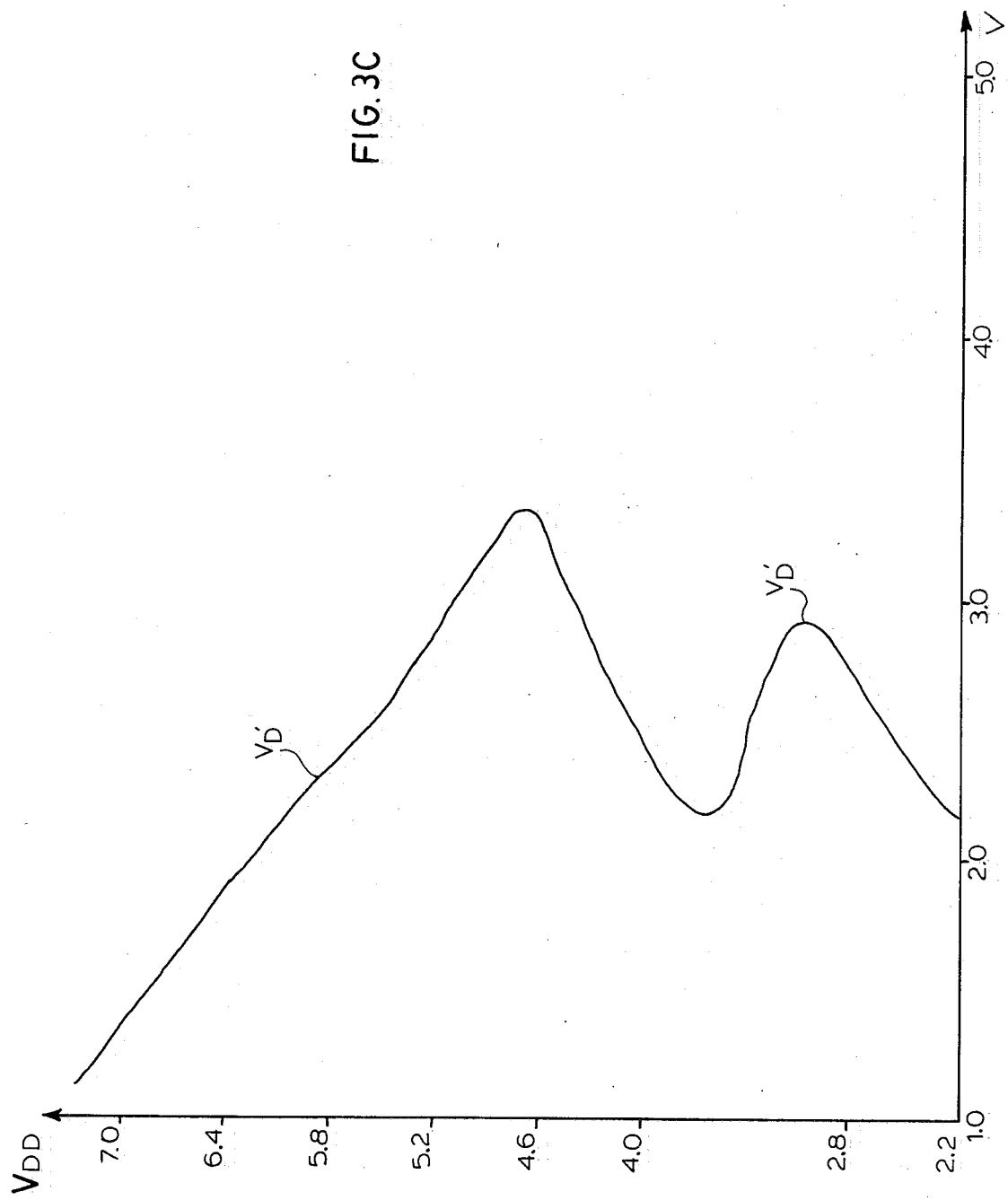

The voltages at nodes C, D, and C', D' as a function of the bus voltage $V_{DD}$ are shown in FIGS. 3 a, b and c.

The threshold and maximum current output of each stage of the circuit are as follows:

| Output Stage | Threshold Voltage | Maximum Current |
|---|---|---|
| 14 | 2.6 | 8.1 mA |
| 16 | 2.9 | 6.7 mA |
| 18 | 3.2 | 9.4 mA |
| 14' | 6.0 | 10.9 mA |
| 16' | 4.2 | 8.1 mA |

Figure 2:
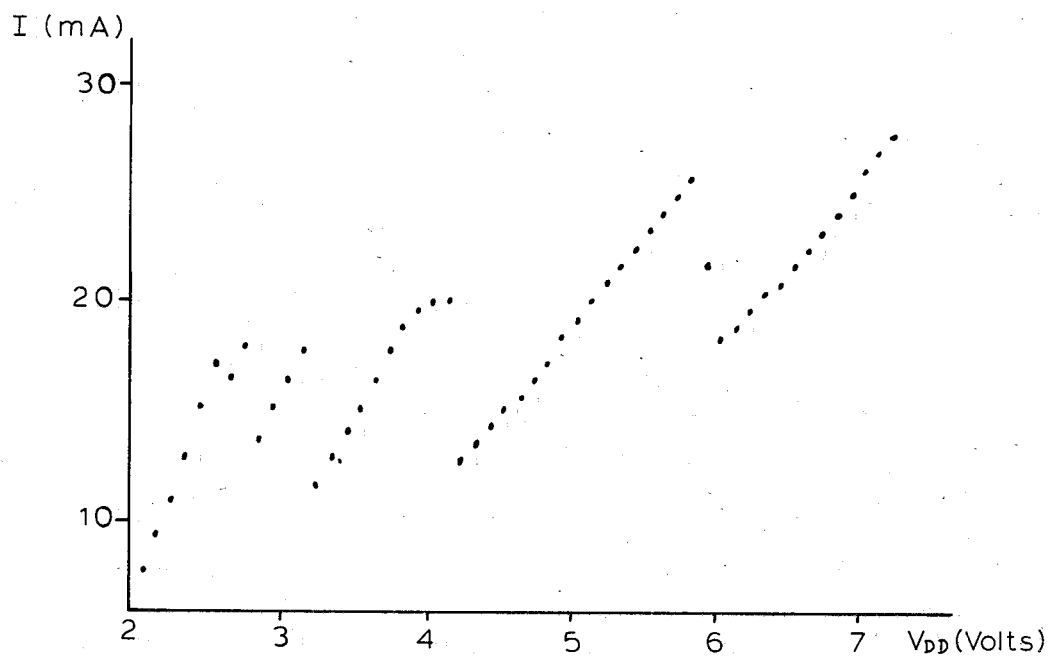
FIG. 2 shows the current output of the circuit of FIG. 1 as a function of the supply voltage.

The overall response of the circuit of FIG. 1 is shown in FIG. 2. It can be seen that the output current of the driver varies from 7.5 mA at 2 V to 27.5 mA at 7.2 V. As successive thresholds of different stages are reached with increasing $V_{DD}$, the stages are turned off one by one causing a sudden drop in the output current of the driver. In between these threshold levels the output current increases linearly with the bus voltage $V_{DD}$.

The specific example illustrates how the components of the various stages are selected to provide the desired effect. Obviously for different bus voltage levels and/or current requirements the biasing and threshold voltage levels are different. Depending on the particular application any number of output stages could be used. The number of voltage sensing and biasing stages is dictated by the selected number and sensitivity of the output stages. For relatively few output stages (such as two, for example) the biasing stage may be omitted.

Thus obviously a large number of variations could be made from the specific example given above without departing from the scope of the invention as defined in the appended claims.

I claim:

1. A driver circuit for supplying current through an output port from a power supply in response to an input signal, comprising:
    means for sensing the voltage level of said power supply that generates a sensed voltage that varies in accordance with said power supply voltage;
    biasing means for amplifying said sensed voltage to generate a biasing voltage; and
    a plurality of output stages that supply current to said output port, each output stage having an input port, said output stages being activated by appropriate voltages on their input ports, whereby said biasing means can selectively activate said output stages when said biasing voltage is applied to the input ports, each said output stage including two complementary transistors forming an output inverter, said inverter being activated by said biasing means and each said output stage further including an output transistor for supplying current from said power supply to said output port, said output transistor being activated by said output inverter.

2. The driver circuit of claim 1 wherein said sensing means comprises a voltage divider consisting of a plurality of transistors, said transistors being hooked up to act as a resistor elements, and in series across the power supply lines.

3. The driver circuit of claim 2 wherein said biasing means comprises two complementary transistors which form an inverter, said inverter being activated by said sensing means and the output of said inverter generating said biasing voltage.

4. The driver circuit of claim 3 wherein said inverter has a wide transition range.

5. A driver circuit for supplying current through an output port from a power supply in response to an input signal, comprising:
    means for sensing the voltage level of said power supply that generates a sensed voltage that varies in accordance with said power supply voltage;
    biasing means for amplifying said sensed voltage to generate a biasing voltage; and
    a plurality of output stages that supply current to said output port, each said output stage having an input port, said output stages being activated by appropriate voltages on their input ports, whereby said biasing means can selectively activate said output stages when said biasing voltage is applied to the input ports, each said output stage includes two complementary transistors forming an output inverter said inverter being activated by said biasing means and each said output stage has a different threshold voltage wherein said biasing means is adapted to activate more output stages for a relatively low power supply voltage than for a relatively high output voltage.

* * * * *